(12) United States Patent
Shen et al.

(10) Patent No.: US 8,686,634 B2
(45) Date of Patent: Apr. 1, 2014

(54) ORGANIC LIGHT EMITTING DISPLAY AND METHOD FOR MANUFACTURING THE SAME

(75) Inventors: Weng-Chang Shen, Taoyuan County (TW); Hsu-Hsiang Tseng, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 0 days.

(21) Appl. No.: 13/279,348

(22) Filed: Oct. 24, 2011

(65) Prior Publication Data

US 2013/0099660 A1 Apr. 25, 2013

(51) Int. Cl.
*H01L 51/00* (2006.01)

(52) U.S. Cl.
USPC ............................................. 313/512; 445/24

(58) Field of Classification Search
USPC ................................ 445/24–25; 313/498–512
See application file for complete search history.

(56) References Cited

U.S. PATENT DOCUMENTS

| | | | |
|---|---|---|---|
| 7,304,702 B2 | 12/2007 | Wang | |
| 2004/0009303 A1* | 1/2004 | Ito et al. | 427/421 |
| 2005/0269947 A1* | 12/2005 | Kobayashi | 313/504 |
| 2008/0272689 A1* | 11/2008 | Ide et al. | 313/504 |
| 2009/0160331 A1* | 6/2009 | Omata et al. | 313/506 |
| 2011/0204771 A1* | 8/2011 | Lee et al. | 313/504 |
| 2011/0216281 A1* | 9/2011 | Lee et al. | 349/155 |

* cited by examiner

*Primary Examiner* — Anne Hines
(74) *Attorney, Agent, or Firm* — Jianq Chyun IP Office

(57) ABSTRACT

An organic light emitting display (OLED) including a transparent substrate, a mirror layer, a transparent insulating layer, and an organic light emitting displaying layer is provided. The mirror layer is disposed on the transparent substrate and has a plurality of openings. The transparent insulating layer is disposed on the transparent substrate and covers the mirror layer. The organic light emitting displaying layer is disposed on the transparent insulating layer and has a plurality of pixel regions. The openings are aligned to the pixel regions respectively. In addition, a method for manufacturing the OLED is also provided.

12 Claims, 6 Drawing Sheets

ORGANIC LIGHT EMITTING DISPLAY AND METHOD FOR MANUFACTURING THE SAME

BACKGROUND OF THE INVENTION

1. Field of the Invention

The present invention relates to a display and a method for manufacturing the same, and in particular, to an organic light emitting display (OLED) and a method for manufacturing the same.

2. Description of Related Art

Modern people generally use a mirror as a tool for tidying up their appearances, but not all people take the mirror with them when going out. However, a mobile phone is a portable device, so many people has the experience of using a display surface of the mobile phone as a mirror. Generally, the display surface of the mobile phone is difficult to reflect an image as clearly as a mirror, which cannot satisfy requirements of a user.

Due to advantages of an OLED such as self-light-emitting, view angle independence, a simple process, a low cost, a low temperature operation range, a high reply speed, and full color, the OLED has a great utilization potentiality and is expected to become a main stream of a next generation flat panel display. Therefore, if a display surface of an organic electro-luminescence display is further designed so that the display surface has a reflect effect like that of a mirror and the display surface is applied to the mobile phone, a mobile phone disposed with the OLED is more favored by consumers to create business opportunities.

SUMMARY OF THE INVENTION

The present invention is directed to an OLED, which can provide a function of a mirror and has good display brightness.

The present invention is directed to a method for manufacturing an OLED, in which an OLED manufactured by using the method can provide a function of a mirror and has good display brightness.

The present invention provides an OLED, which includes a transparent substrate, a mirror layer, a transparent insulating layer, and an organic light emitting displaying layer. The mirror layer is disposed on the transparent substrate and has a plurality of openings. The transparent insulating layer is disposed on the transparent substrate and covers the mirror layer. The organic light emitting displaying layer is disposed on the transparent insulating layer and has a plurality of pixel regions. The openings are aligned to the pixel regions respectively.

In an embodiment of the present invention, a material of the mirror layer includes aluminum or silver.

In an embodiment of the present invention, the transparent insulating layer has a plane, and the organic light emitting displaying layer is disposed on the plane.

In an embodiment of the present invention, the organic light emitting displaying layer includes a plurality of first electrodes, a plurality of organic light emitting materials, a patterning isolation wall, and a plurality of second electrodes. The first electrodes are disposed on the transparent insulating layer. The organic light emitting materials are disposed on the first electrodes and located in the pixel regions. The patterning isolation wall is disposed on the transparent insulating layer and used for isolating the organic light emitting materials from one another. The second electrodes are disposed on the organic light emitting materials, in which a plurality of overlap regions of the first electrodes and the second electrodes is aligned to the openings respectively.

In an embodiment of the present invention, the OLED further includes a lid body, disposed on the transparent insulating layer, in which a sealed space is formed between the lid body and the transparent insulating layer, and the first electrodes, the organic light emitting materials, the patterning isolation wall, and the second electrodes are located in the sealed space.

In an embodiment of the present invention, the OLED further includes a drying agent, disposed on the lid body and located in the sealed space.

The present invention provides a method for manufacturing an OLED. The method includes: providing a transparent substrate; forming a mirror layer on the transparent substrate, in which the mirror layer has a plurality of openings; forming a transparent insulating layer on the transparent substrate, in which the transparent insulating layer covers the mirror layer; and forming an organic light emitting displaying layer on the transparent insulating layer, in which the organic light emitting displaying layer has a plurality of pixel regions, and the openings are aligned to the pixel regions respectively.

In an embodiment of the present invention, the step of forming the mirror layer on the transparent substrate includes an evaporating process.

In an embodiment of the present invention, the transparent insulating layer has a plane, and the step of forming the organic light emitting displaying layer on the transparent insulating layer includes forming the organic light emitting displaying layer on the plane.

In an embodiment of the present invention, the step of forming the organic light emitting displaying layer on the transparent insulating layer includes: forming a plurality of first electrodes on the transparent insulating layer; forming a patterning isolation wall on the transparent insulating layer; forming a plurality of organic light emitting materials on the first electrodes, in which the patterning isolation wall is used for isolating the organic light emitting materials from one another, and the organic light emitting materials are located in the pixel regions; and forming a plurality of second electrodes on the organic light emitting materials, in which a plurality of overlap regions of the first electrodes and the second electrodes is aligned to the openings respectively.

In an embodiment of the present invention, the method for manufacturing the OLED further includes forming a lid body on the transparent insulating layer, in which a sealed space is formed between the lid body and the transparent insulating layer, and the first electrodes, the organic light emitting materials, the patterning isolation wall, and the second electrodes are located in the sealed space.

In an embodiment of the present invention, the method for manufacturing the OLED further includes forming a drying agent on the lid body, in which the drying agent is located in the sealed space.

To sum up, in the OLED of the present invention, the mirror layer exists on the transparent substrate, and the openings of the mirror layer are aligned to the pixel regions of the organic displaying layer respectively. Through the disposing, the OLED can reflect the image with the mirror layer, and light emitted from the pixel regions of the organic light emitting displaying layer can pass through the transparent substrate to the outside via the openings of the mirror layer. Therefore, the OLED can provide the function of the mirror and has good display brightness.

In order to make the features and advantages of the present invention clearer and more comprehensible, the present invention is described in detail below with reference to embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
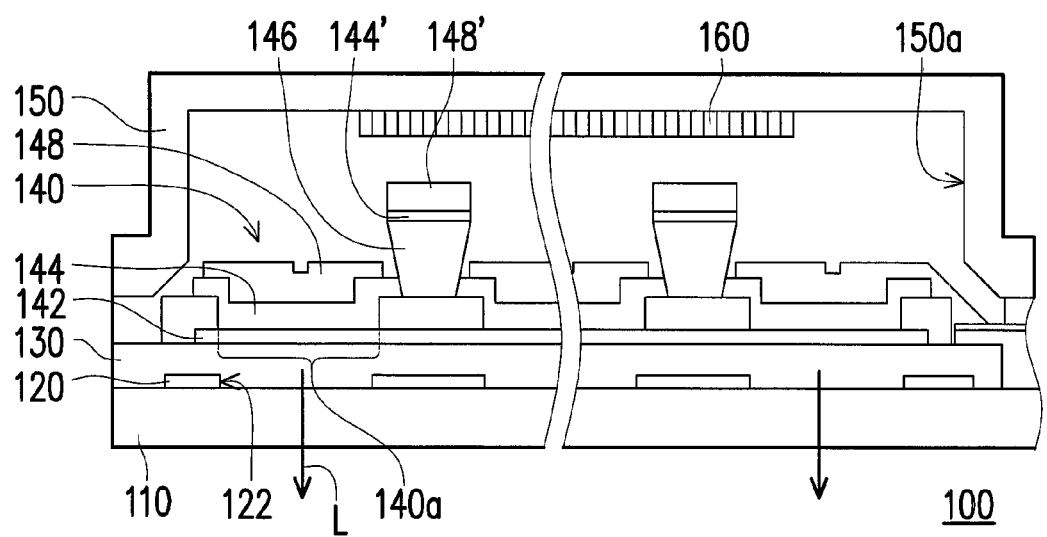
FIG. 1 is a sectional view of an OLED according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a sectional view of an OLED according to an embodiment of the present invention. Referring to FIG. 1, the OLED 100 in this embodiment includes a transparent substrate 110, a mirror layer 120, a transparent insulating layer 130, and an organic light emitting displaying layer 140. The mirror layer 120 is disposed on the transparent substrate 110 and has a plurality of openings 122. The transparent insulating layer 130 is disposed on the transparent substrate 110 and covers the mirror layer 120. The organic light emitting displaying layer 140 is disposed on the transparent insulating layer 130 and has a plurality of pixel regions 140a. The openings 122 are aligned to the pixel regions 140a respectively.

Through the disposing, the OLED 100 can reflect an image with the mirror layer 120, and light L emitted from the pixel regions 140a of the organic light emitting displaying layer 140 can pass through the transparent substrate 110 to the outside via the openings 122 of the mirror layer 120. Therefore, the OLED 100 can provide a function of a mirror and has good display brightness. The OLED 100 in this embodiment can be applied to a mobile phone and used as a display interface of the mobile phone, and a user can use a portable mobile phone as a mirror, so that functions of the mobile phone are more diversified.

In particular, the pixel regions 140a are, for example, generally so-called sub-pixels, and the sub-pixels include red sub-pixels, green sub-pixels, and blue sub-pixels. In this embodiment, a part of the pixel regions 140a are red sub-pixels, a part of the pixel regions 140a are green sub-pixels, and a part of the pixel regions 140a are blue sub-pixels. A red sub-pixel, a green sub-pixel, and a blue sub-pixel form a complete pixel.

In this embodiment, the transparent insulating layer 130 is disposed to prevent the mirror layer 120 and the organic light emitting displaying layer 140 from generating electrical conduction to impact on the normal operation of the OLED 100. In addition, the transparent insulating layer 130 has a plane 132, and the organic light emitting displaying layer 140 is disposed on the plane 132 provided by the transparent insulating layer 130.

Figure 2:
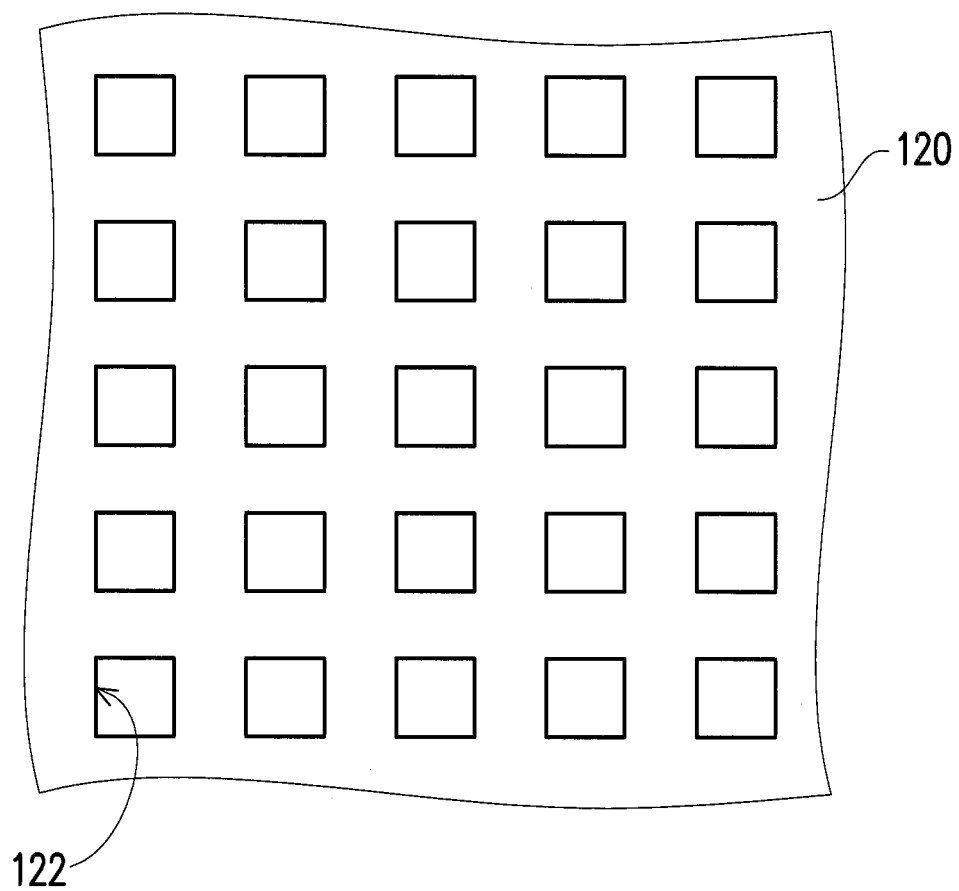
FIG. 2 is a partial top view of a mirror layer in FIG. 1.
Figure 3:
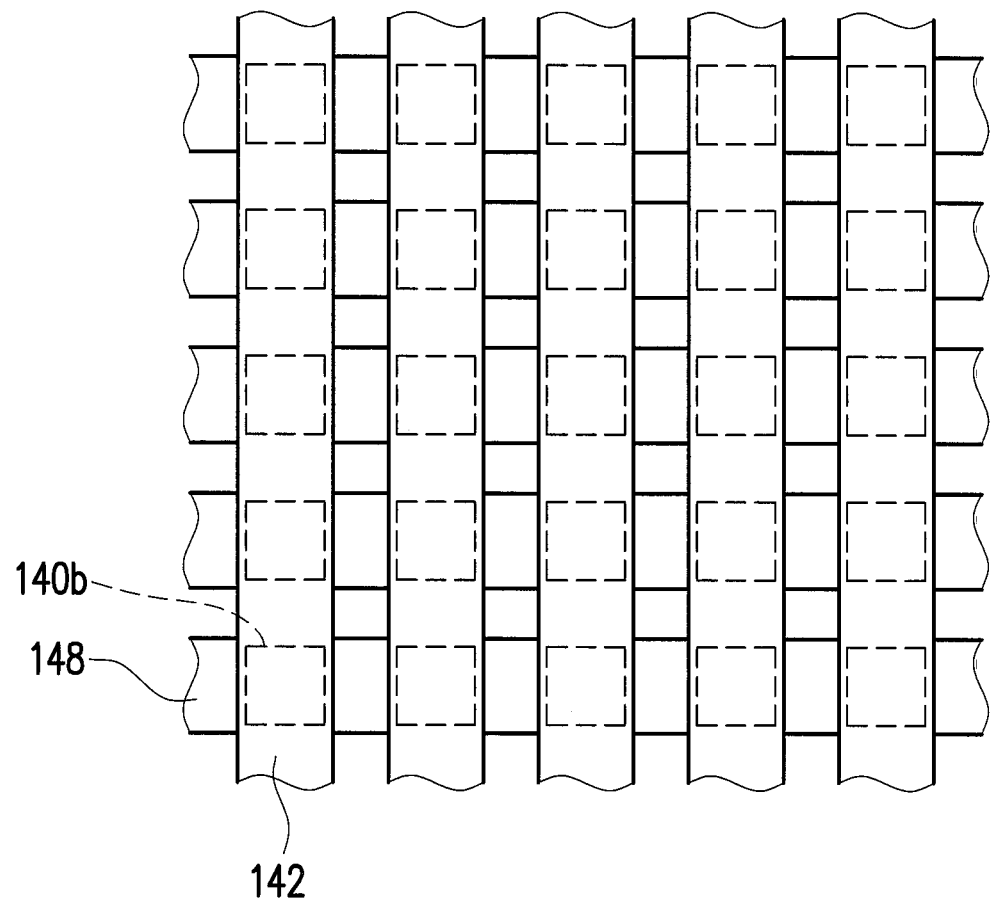
FIG. 3 is a partial top view of a first electrode and a second electrode in FIG. 1.

FIG. 2 is a partial top view of the mirror layer in FIG. 1. FIG. 3 is a partial top view of a first electrode and a second electrode in FIG. 1. Referring to FIG. 1 to FIG. 3, in particular, the organic light emitting displaying layer 140 in this embodiment includes a plurality of first electrodes 142, a plurality of organic light emitting materials 144, a patterning isolation wall 146, and a plurality of second electrodes 148. The first electrodes 142 are disposed on the transparent insulating layer 130. The organic light emitting materials 144 are disposed on the first electrodes 142 and located in the pixel regions 140a. The patterning isolation wall 146 is disposed on the transparent insulating layer 130 and used for isolating the organic light emitting materials 144 from one another. The second electrodes 148 are disposed on the organic light emitting materials 144. A plurality of overlap regions 140b of the first electrodes 142 and the second electrodes 148 is aligned to the openings 122 respectively. In other words, the overlap regions 140b are aligned to the pixel regions 140a respectively, and the organic light emitting materials 144 are respectively located in the overlap regions 140b and electrically connected to the first electrodes 142 and the second electrodes 148.

In this embodiment, a material of the mirror layer 120 is, for example, aluminum, silver, or other materials of a high reflectivity. A material of the transparent substrate 110 is glass, plastic, or a flexible material. A material of the first electrode 142 and the second electrode 148 is, for example, metal, metal oxide, metal nitride, or metal nitrogen oxide. Each organic light emitting material is, for example, an organic light emitting material emitting white light or other color lights.

Referring to FIG. 1, in the embodiment, the OLED 100 further includes a lid body 150 and a drying agent 160. The lid body 150 is disposed on the transparent insulating layer 130. A sealed space 150a is formed between the lid body 150 and the transparent insulating layer 130. The drying agent 160 is disposed on the lid body 150 and located in the sealed space 150a. The first electrodes 142, the organic light emitting materials 144, the patterning isolation wall 146, and the second electrodes 148 are located in the sealed space 150a to prevent external moisture from contacting the organic light emitting displaying layer 140 to impact the normal operation of the organic light emitting displaying layer 140.

Figure 4A:
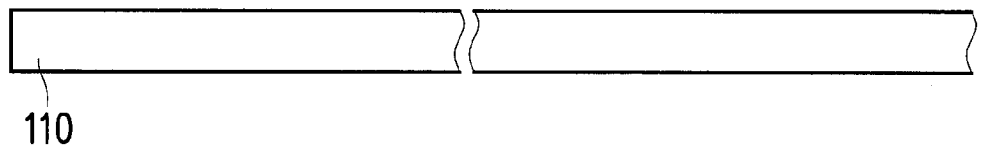
FIG. 4A to FIG. 4G are flow charts of a method for manufacturing the OLED in FIG. 1.
Figure 4B:
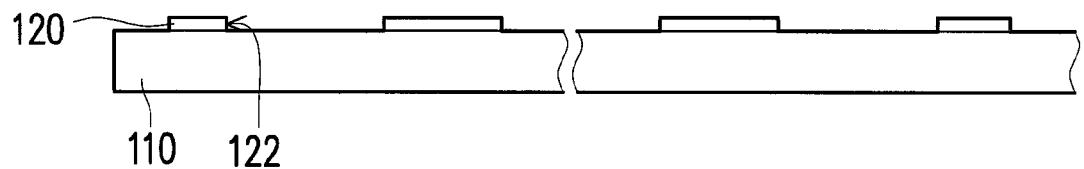
Figure 4C:
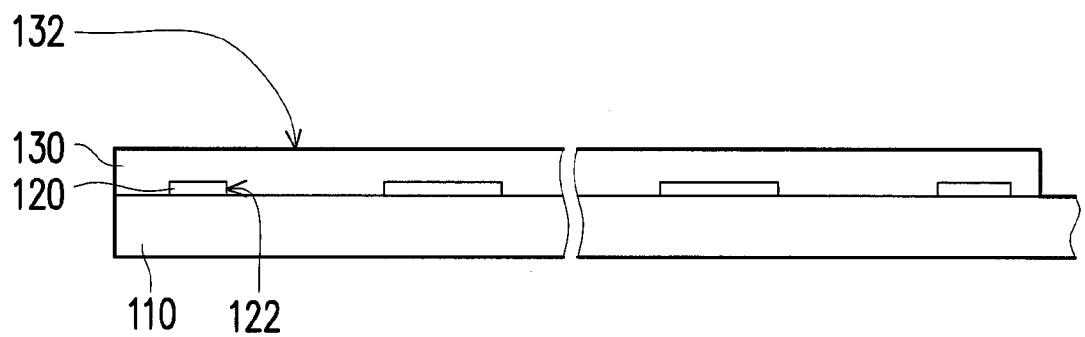

A method for manufacturing the OLED 100 in FIG. 1 is described below with reference to figures. FIG. 4A to FIG. 4G are flow charts of a method for manufacturing the OLED in FIG. 1. Referring to FIG. 4A, a transparent substrate 110 is provided. Referring to FIG. 4B, a mirror layer 120 is formed on the transparent substrate 110, in which the mirror layer 120 has a plurality of openings 122. The mirror layer 120 is formed by, for example, an evaporating process. Referring to FIG. 4C, a transparent insulating layer 130 is formed on the transparent substrate 110, in which the transparent insulating layer 130 covers the mirror layer 120 and has a plane 132.

Figure 4D:
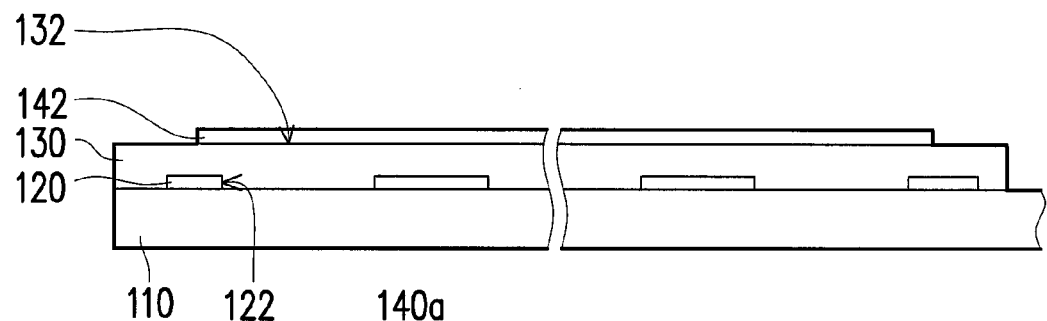
Figure 4E:
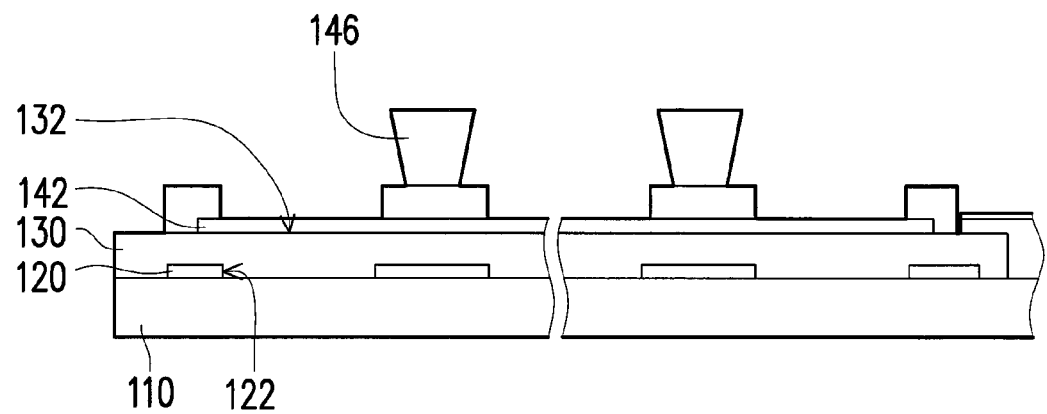
Figure 4F:
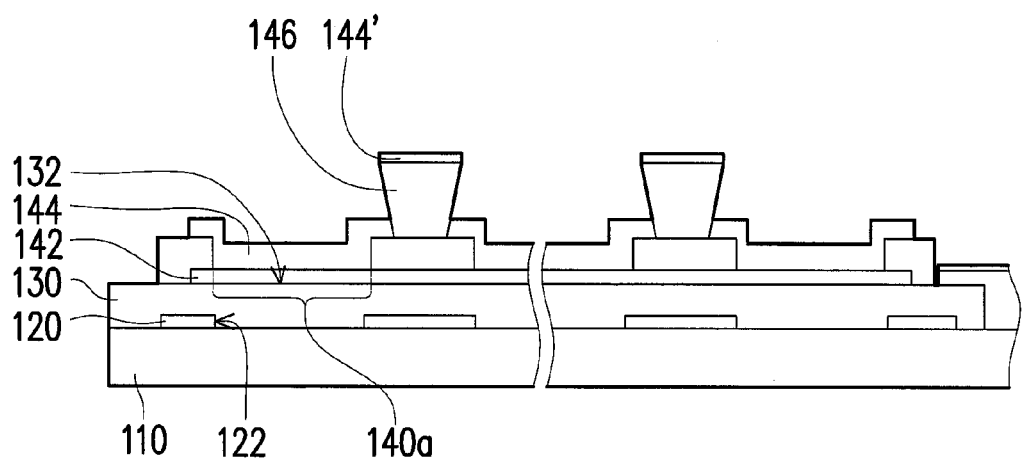
Figure 4G:
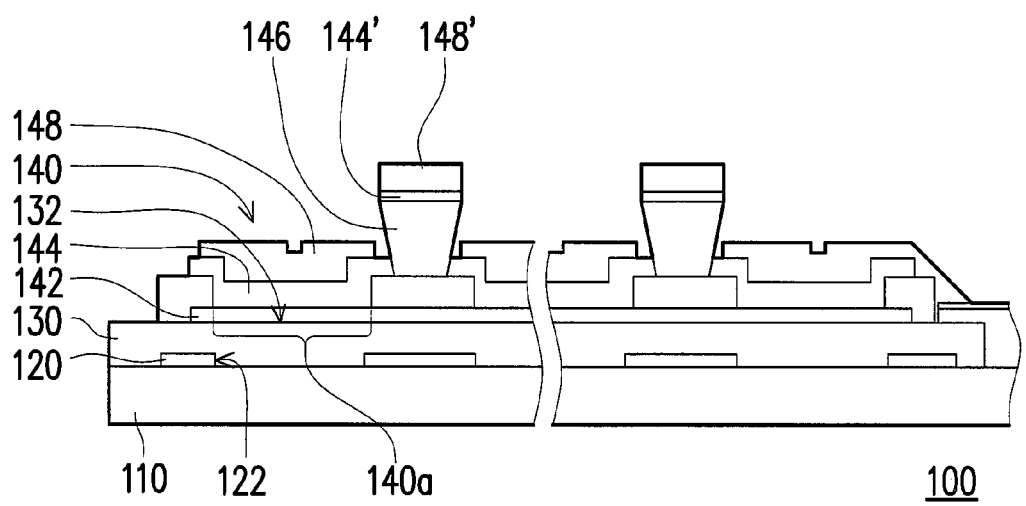

Referring to FIG. 4D, a plurality of first electrodes 142 (only one first electrode is depicted) is formed on the transparent insulating layer 130. Referring to FIG. 4E, a patterning isolation wall 146 is formed on the transparent insulating layer 130. Referring to FIG. 4F, a plurality of organic light emitting materials 144 is formed on the first electrodes 142, in which the patterning isolation wall 146 is used for isolating the organic light emitting materials 144 from one another, and a place where each organic light emitting material is located is a pixel region 140a. Referring to FIG. 4G, a plurality of second electrodes 148 is formed on the organic light emitting materials 144, in which a plurality of overlap regions 140b (depicted in FIG. 3) of the first electrodes 142 and the second electrodes 148 is aligned to the openings 122 respectively. At this time, the organic light emitting displaying layer 140 is disposed completely. The organic light emitting displaying layer 140 is located on the plane 132 of the transparent insulating layer 130 and includes the first electrode 142, the organic light emitting material 144, the patterning isolation wall 146, and the second electrode 148.

As show in FIG. 4E, a height difference exists between the patterning isolation wall 146 and the first electrodes 142, and a section of the patterning isolation wall 146 is, for example, an inverted trapezoid. Therefore, in a process of forming the organic light emitting materials 144 in FIG. 4F formed through sputtering or other common deposition processes, a part 144' of the organic light emitting materials 144 deposited on the patterning isolation wall 146 are naturally disconnected from the organic light emitting materials 144 deposited on the first electrode 142 to prevent unexpected electrical connection among the organic light emitting materials 144. Similarly, in a process of forming the second electrodes 148 in FIG. 4G formed through sputtering or other common deposition processes, a part 148' of the second electrodes 148 deposited on the patterning isolation wall 146 are naturally disconnected from the second electrodes 148 deposited on the organic light emitting materials 144 to prevent unexpected electrical connection among the second electrodes 148.

Finally, referring to FIG. 1, a lid body 150 is formed on the transparent insulating layer 130, and a drying agent 160 is formed on the lid body 150. A sealed space 150a is formed between the lid body 150 and the transparent insulating layer 130. The drying agent 160, the first electrodes 142, the organic light emitting materials 144, the patterning isolation wall 146, and the second electrodes 148 are located in the sealed space 150a to prevent external moisture from contacting the organic light emitting displaying layer 140 to impact the normal operation of the organic light emitting displaying layer 140.

To sum up, in the OLED of the present invention, the mirror layer exists on the transparent substrate, and the openings of the mirror layer are aligned to the pixel regions of the organic displaying layer respectively. Through the disposing, the OLED can reflect the image with the mirror layer, and light emitted from the pixel regions of the organic light emitting displaying layer can pass through the transparent substrate to the outside via the openings of the mirror layer. Therefore, the OLED can provide the function of the mirror and has good display brightness.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light emitting display (OLED), comprising:
   a transparent substrate;
   a mirror layer, disposed on the transparent substrate and comprising a plurality of openings;
   a transparent insulating layer, disposed on the transparent substrate and covering the mirror layer, wherein the transparent insulating layer directly contacts the mirror layer, and the openings are filled with parts of the transparent insulating layer; and
   an organic light emitting displaying layer, disposed on the transparent insulating layer and comprising a plurality of pixel regions and a plurality of organic light emitting materials located in the pixel regions, wherein each of the pixel regions is a sub-pixel and the openings are aligned to the pixel regions respectively, and a width of each of the openings is not larger than a width of the corresponding organic light emitting material.

2. The OLED according to claim 1, wherein a material of the mirror layer comprises aluminum or silver.

3. The OLED according to claim 1, wherein the transparent insulating layer comprises a plane, and the organic light emitting displaying layer is disposed on the plane.

4. The OLED according to claim 1, wherein the organic light emitting displaying layer comprises:
   a plurality of first electrodes, disposed on the transparent insulating layer, wherein the organic light emitting materials are disposed on the first electrodes;
   a patterning isolation wall, disposed on the transparent insulating layer and used for isolating the organic light emitting materials from one another; and
   a plurality of second electrodes, disposed on the organic light emitting materials, wherein a plurality of overlap regions of the first electrodes and the second electrodes is aligned to the openings respectively.

5. The OLED according to the claim 4, further comprising:
   a lid body, disposed on the transparent insulating layer, wherein a sealed space is formed between the lid body and the transparent insulating layer, and the first electrodes, the organic light emitting materials, the patterning isolation wall, and the second electrodes are located in the sealed space.

6. The OLED according to the claim 5, further comprising:
   a drying agent, disposed on the lid body and located in the sealed space.

7. A method for manufacturing an organic light emitting display (OLED), comprising:
   providing a transparent substrate;
   forming a mirror layer on the transparent substrate, wherein the mirror layer comprises a plurality of openings;
   forming a transparent insulating layer on the transparent substrate, wherein the transparent insulating layer directly contacts and covers the mirror layer, and the openings are filled with parts of the transparent insulating layer; and
   forming an organic light emitting displaying layer on the transparent insulating layer, wherein the organic light emitting displaying layer comprises a plurality of pixel regions, each of the pixel regions is a sub-pixel and the openings are aligned to the pixel regions respectively, wherein the step of forming the organic light emitting displaying layer on the transparent insulating layer comprises forming a plurality of organic light emitting materials located in the pixel regions, and a width of each of the openings is not larger than a width of the corresponding organic light emitting material.

8. The method for manufacturing an OLED according to claim 7, wherein the step of forming the mirror layer on the transparent substrate comprises an evaporating process.

9. The method for manufacturing an OLED according to claim 7, wherein the transparent insulating layer comprises a plane, and the step of forming the organic light emitting displaying layer on the transparent insulating layer comprises:
   forming the organic light emitting displaying layer on the plane.

10. The method for manufacturing an OLED according to claim 7, wherein the step of forming the organic light emitting displaying layer on the transparent insulating layer comprises:
    forming a plurality of first electrodes on the transparent insulating layer;

forming a patterning isolation wall on the transparent insulating layer;

forming the plurality of organic light emitting materials on the first electrodes, wherein the patterning isolation wall is used for isolating the organic light emitting materials from one another; and forming a plurality of second electrodes on the organic light emitting materials, wherein a plurality of overlap regions of the first electrodes and the second electrodes is aligned to the openings respectively.

11. The method for manufacturing an OLED according to the claim 10, further comprising:

forming a lid body on the transparent insulating layer, wherein a sealed space is formed between the lid body and the transparent insulating layer, and the first electrodes, the organic light emitting materials, the patterning isolation wall, and the second electrodes are located in the sealed space.

12. The method for manufacturing an OLED according to the claim 11, further comprising:

forming a drying agent on the lid body, wherein the drying agent is located in the sealed space.

* * * * *